(12) United States Patent
Miyakawa et al.

(10) Patent No.: US 11,296,008 B2
(45) Date of Patent: Apr. 5, 2022

(54) ALUMINUM-SILICON CARBIDE COMPOSITE AND PRODUCTION METHOD THEREFOR

(71) Applicant: DENKA COMPANY LIMITED, Tokyo (JP)

(72) Inventors: Takeshi Miyakawa, Omuta (JP); Motonori Kino, Omuta (JP); Hideki Hirotsuru, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 1102 days.

(21) Appl. No.: 15/500,210

(22) PCT Filed: Jul. 29, 2015

(86) PCT No.: PCT/JP2015/071493
§ 371 (c)(1),
(2) Date: May 8, 2017

(87) PCT Pub. No.: WO2016/017689
PCT Pub. Date: Feb. 4, 2016

(65) Prior Publication Data
US 2017/0236767 A1    Aug. 17, 2017

(30) Foreign Application Priority Data
Jul. 31, 2014  (JP) .............................. JP2014-157224

(51) Int. Cl.
*H01L 23/373* (2006.01)
*B22D 19/00* (2006.01)
(Continued)

(52) U.S. Cl.
CPC .......... *H01L 23/3733* (2013.01); *B21J 1/003* (2013.01); *B21J 5/002* (2013.01); *B22D 17/00* (2013.01);
(Continued)

(58) Field of Classification Search
CPC ........... B21J 1/003; B21J 5/002; B22D 17/00; B22D 18/02; B22D 19/00; B22D 19/04;
(Continued)

(56) References Cited

U.S. PATENT DOCUMENTS

| 5,119,864 A | 6/1992 | Langensiepen et al. |
| 5,508,560 A | 4/1996 | Koehler et al. |
| 2007/0248829 A1 | 10/2007 | Iwamoto et al. |

FOREIGN PATENT DOCUMENTS

| JP | H05-507030 A | 10/1993 |
| JP | H07-183436 A | 7/1995 |

(Continued)

OTHER PUBLICATIONS

Machine Translation of JP 2005-145746 (Year: 2005).*
Oct. 13, 2015 International Search Report issued with International Patent Application No. PCT/JP2015/071493.

*Primary Examiner* — Sathavaram I Reddy
(74) *Attorney, Agent, or Firm* — Oliff PLC

(57) ABSTRACT

An aluminum-silicon carbide composite including flat-plate-shaped composited portion containing silicon carbide and an aluminum alloy, and aluminum layers containing an aluminum alloy provided on both plate surfaces of composited portion, wherein circuit board is mounted on one plate surface and the other plate surface is used as heat-dissipating surface, wherein: the heat-dissipating-surface-side plate surface of the composited portion has a convex curved shape; the heat-dissipating-surface-side aluminum layer has a convex curved shape; ratio (Ax/B) between the average (Ax) of the thicknesses at the centers on opposing short sides of outer peripheral surfaces and thickness (B) at central portions of the plate surfaces satisfies the relationship: $0.91 \leq Ax/B \leq 1.00$; and a ratio (Ay/B) between the average (Ay) of the thicknesses at the centers on opposing long sides of outer peripheral surfaces and thickness (B) at central portions of
(Continued)

the plate surfaces satisfies the relationship: $0.94 \leq Ay/B \leq 1.00$ and production method therefor.

8 Claims, 3 Drawing Sheets

(51) Int. Cl.
| | |
|---|---|
| C22C 21/04 | (2006.01) |
| B22D 19/04 | (2006.01) |
| H01L 23/36 | (2006.01) |
| B21J 1/00 | (2006.01) |
| B21J 5/00 | (2006.01) |
| B22D 17/00 | (2006.01) |
| B22D 18/02 | (2006.01) |
| B22D 21/00 | (2006.01) |
| B32B 3/26 | (2006.01) |
| B32B 9/00 | (2006.01) |
| B32B 9/04 | (2006.01) |
| B32B 15/20 | (2006.01) |
| H01L 23/367 | (2006.01) |
| H05K 1/02 | (2006.01) |
| H05K 3/00 | (2006.01) |

(52) U.S. Cl.
CPC ............. *B22D 18/02* (2013.01); *B22D 19/00* (2013.01); *B22D 19/04* (2013.01); *B22D 21/007* (2013.01); *B32B 3/263* (2013.01); *B32B 9/005* (2013.01); *B32B 9/041* (2013.01); *B32B 15/20* (2013.01); *C22C 21/04* (2013.01); *H01L 23/36* (2013.01); *H01L 23/3672* (2013.01); *H01L 23/3735* (2013.01); *B32B 2250/03* (2013.01); *B32B 2260/02* (2013.01); *B32B 2260/04* (2013.01); *B32B 2307/302* (2013.01); *B32B 2307/734* (2013.01); *B32B 2457/08* (2013.01); *H01L 2924/0002* (2013.01); *H05K 1/0203* (2013.01); *H05K 1/0209* (2013.01); *H05K 3/0061* (2013.01); *H05K 2201/066* (2013.01)

(58) Field of Classification Search
CPC ....... B22D 21/007; B32B 3/263; B32B 9/005; B32B 9/041; B32B 15/20; B32B 2250/03; B32B 2260/02; B32B 2260/04; B32B 2307/302; B32B 2307/734; B32B 2457/08; C22C 21/04; H01L 23/36; H01L 23/3672; H01L 23/3733; H01L 23/3735; H01L 2924/0002; H05K 1/0203; H05K 1/0209; H05K 3/0061; H05K 2201/066
See application file for complete search history.

(56) References Cited

FOREIGN PATENT DOCUMENTS

| | | |
|---|---|---|
| JP | 2005-064261 A | 3/2005 |
| JP | 2005-145746 A | 6/2005 |
| WO | 2006/030676 A1 | 3/2006 |

* cited by examiner

[Fig.1]
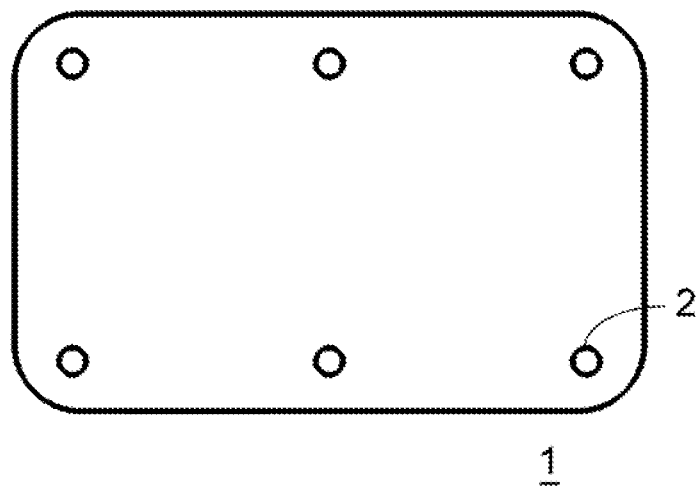
[Fig.2]
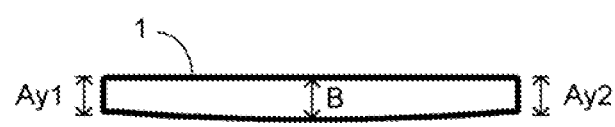
(a)
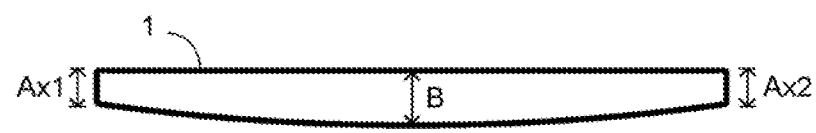
(b)

[Fig.3]
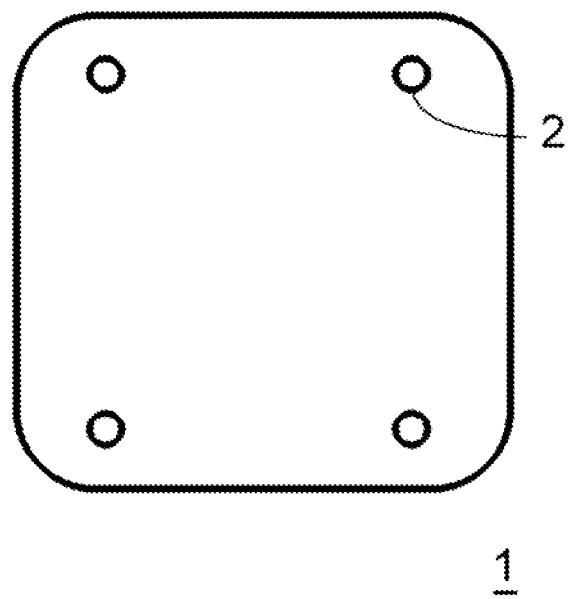
1
[Fig.4]
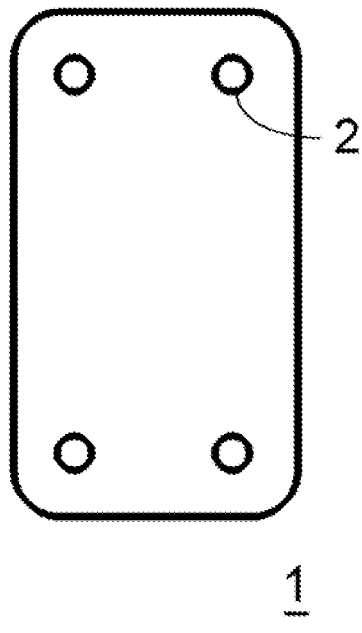
1

[Fig.5]
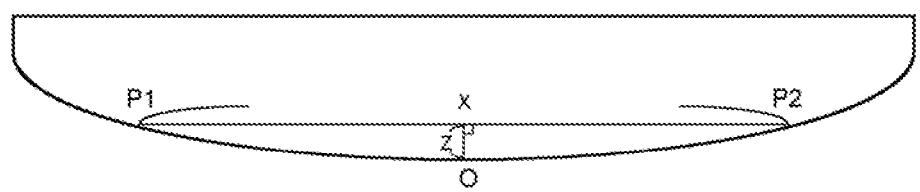

ALUMINUM-SILICON CARBIDE COMPOSITE AND PRODUCTION METHOD THEREFOR

TECHNICAL FIELD

The present invention relates to an aluminum-silicon carbide composite and a production method therefor.

BACKGROUND ART

In a typical heat-dissipating structure of a conventional circuit board, a base plate is soldered via a metal plate (for instance, a copper plate) of the rear face (heat-dissipating surface) of the circuit board and copper and aluminum are common as the base plate. In addition, an aluminum alloy-silicon carbide composite is proposed as a base plate of which the coefficient of thermal expansion is close to that of the circuit board (Patent Document 1).

In many cases, the base plate is used by being joined to a radiating fin, a heat-dissipating unit or the like and the shape and the curvature of the joined portion are also raised as important characteristics. When joined to the radiating fin, for instance, the base plate is generally used by being fixed to the radiating fin, the heat-dissipating unit or the like with a screw by using holes provided in the peripheral edge portion of the base plate.

For instance, a base plate in which a convex curvature has previously been formed is used in some cases so as to form as small a gap as possible between the base plate and the radiating fin. A method is proposed in which the surface of the base plate is cut by machining to form the curvature, but the aluminum-silicon carbide composite has the problems of being very hard and requiring considerable cutting using a diamond cutting tool or the like and product prices increasing accordingly.

In order to solve such problems, an aluminum alloy-silicon carbide composite in which aluminum layers containing an aluminum alloy are provided on both plate surfaces and the aluminum layer is worked thereafter (Patent Document 2).

Patent Document 1: JP H05-507030
Patent Document 2: JP 2005-64261 A

SUMMARY OF INVENTION

In cases in which the base plate is joined to the radiating fin, there has been the problem of many microscopic asperities existing on the surface of the base plate, which comes in contact with the radiating fin or the like, and adhesiveness between the base plate and the radiating fin decreasing. For this reason, there has been the problem of the heat transferability between the base plate and the radiating fin lowering remarkably and the heat dissipation properties of the entire module, which is constituted by a ceramic circuit board, the base plate, the radiating fin and the like, lowering remarkably.

The present invention is designed in consideration of the abovementioned circumstances and provides an aluminum-silicon carbide composite having high adhesiveness to other heat-dissipating components and a production method therefor.

According to the present invention, provided is an aluminum-silicon carbide composite comprising a flat-plate-shaped composited portion containing silicon carbide and an aluminum alloy, and aluminum layers containing an aluminum alloy provided on both plate surfaces of the composited portion, wherein a circuit board is mounted on one of the plate surfaces and the other plate surface is used as a heat-dissipating surface, and wherein: the heat-dissipating-surface-side plate surface of the composited portion has a convex curved shape; the heat-dissipating-surface-side aluminum layer has a convex curved shape; a ratio (Ax/B) between the average (Ax) of the thicknesses at the centers on opposing short sides of outer peripheral surfaces and the thickness (B) at central portions of the plate surfaces satisfies the relationship: $0.91 \leq Ax/B \leq 1.00$; and a ratio (Ay/B) between the average (Ay) of the thicknesses at the centers on opposing long sides of outer peripheral surfaces and the thickness (B) at central portions of the plate surfaces satisfies the relationship: $0.94 \leq Ay/B \leq 1.00$.

According to one aspect of the present invention, in the aluminum-silicon carbide composite, when a circuit board is mounted, the amount of curvature Cx for every 10 cm in the short-side direction of the outer peripheral surfaces satisfies the relationship: $-10 \ \mu m \leq Cx \leq 30 \ \mu m$; and the amount of curvature Cy for every 10 cm in the long-side direction of the outer peripheral surfaces satisfies the relationship: $-10 \ \mu m \leq Cy \leq 40 \ \mu m$.

According to one aspect of the present invention, in the aluminum-silicon carbide composite, the lengths of the short sides and the long sides of the outer peripheral surfaces are equal; and a ratio (A/B) between the average (A) of the thicknesses at the centers on opposing sides of outer peripheral surfaces and the thickness (B) at central portions of the plate surfaces satisfies the relationship: $0.91 \leq A/B \leq 1.00$.

According to one aspect of the present invention, in the aluminum-silicon carbide composite, the average thickness of the aluminum layer on the surface on which the circuit board is mounted is 0.1 mm to 0.3 mm, and the thickness difference of the aluminum layer at said surface is 0.1 mm or less.

According to one aspect of the present invention, in the aluminum-silicon carbide composite, the difference between the average thickness of the aluminum layer on the surface on which the circuit board is mounted and the average thickness of the aluminum layer on the heat-dissipating surface is 50% or less of the average thickness of the thicker aluminum layer.

According to one aspect of the present invention, the aluminum-silicon carbide composite has a thermal conductivity at 25° C. of 180 W/mK or more, and a coefficient of thermal expansion at 150° C. of $10 \times 10^{-6}$/K or less.

According to the present invention, provided is a method for producing the aluminum-silicon carbide composite comprising: a step of forming a flat-plate-shaped silicon carbide porous body; a step of machining one plate surface of the silicon carbide porous body so as to form a convex curved shape; a step of impregnating the silicon carbide porous body with an aluminum alloy so as to produce an aluminum-silicon carbide composite including a flat-plate-shaped composited portion containing silicon carbide and an aluminum alloy, and aluminum layers, containing an aluminum alloy, provided on both plate surfaces of the composited portion; and a step of machining the aluminum layer on the side of the silicon carbide porous body having the surface that has been machined to a convex curved shape, so as to form a heat-dissipating surface having a convex curved shape.

The aluminum-silicon carbide composite of the present invention has high adhesiveness to other heat-dissipating components.

BRIEF DESCRIPTION OF THE DRAWINGS

FIG. 1 is a view showing a conceptual configuration of an aluminum-silicon carbide composite according to an embodiment of the present invention and is a plan view from the plate thickness direction.

FIG. 2 shows side views of the aluminum-silicon carbide composite of FIG. 1, from the short-side direction (FIG. 2(a)) and from the long-side direction (FIG. 2(b)) of the outer peripheral surfaces.

FIG. 3 is a plan view showing a conceptual configuration of an aluminum-silicon carbide composite according to another embodiment of the present invention.

FIG. 4 is a plan view showing a conceptual configuration of an aluminum-silicon carbide composite according to another embodiment of the present invention.

FIG. 5 is a conceptual side view to explain the definition of the amount of curvature in the present invention.

MODES FOR CARRYING OUT THE INVENTION

One embodiment of the aluminum-silicon carbide composite and the method for producing the same according to the present invention will be described below. However, it is self-evident that the present invention is not limited to these embodiments.

The aluminum-silicon carbide composite according to the present embodiment includes a flat-plate-shaped composited portion containing silicon carbide and an aluminum alloy, and aluminum layers containing an aluminum alloy provided on both plate surfaces of the composited portion, wherein a circuit board is mounted on one of the plate surfaces and the other plate surface is used as a heat-dissipating surface, and wherein: the heat-dissipating-surface-side plate surface of the composited portion has a convex curved shape; the heat-dissipating-surface-side aluminum layer has a convex curved shape; a ratio (Ax/B) between the average (Ax) of the thicknesses at the centers on opposing short sides of outer peripheral surfaces and the thickness (B) at central portions of the plate surfaces satisfies the relationship: $0.91 \leq Ax/B \leq 1.00$; and a ratio (Ay/B) between the average (Ay) of the thicknesses at the centers on opposing long sides of outer peripheral surfaces and the thickness (B) at central portions of the plate surfaces satisfies the relationship: $0.94 \leq Ay/B \leq 1.00$.

The above described aluminum-silicon carbide composite has a shape shown in FIG. 1 or FIG. 2, for instance.

As is shown in FIG. 1, the aluminum-silicon carbide composite 1 has a rectangular shape when the plane is viewed from the plate thickness direction, and a through hole 2 through which the aluminum-silicon carbide composite 1 is screwed and fixed to another component is provided on the peripheral edge portion of the plate surface. In addition, as is shown in FIG. 2, the aluminum-silicon carbide composite 1 has an outer peripheral surface surrounding the periphery of the front and rear plate surfaces, and the aluminum-silicon carbide composite 1 has one plate surface having a convex curved shape. In such an aluminum-silicon carbide composite 1, the plate surface having the convex curved shape serves as a heat-dissipating surface, and a circuit board is mounted on the other plate surface.

In the aluminum-silicon carbide composite 1 having the shape shown in FIG. 1 or FIG. 2, when the thicknesses in the plate thickness direction at the central positions on each opposing short side of outer peripheral surfaces are represented by Ax1 and Ax2, the average Ax of the thicknesses at the centers on the opposing short sides of the outer peripheral surfaces is defined by the following expression (1).

$$Ax = (Ax1 + Ax2)/2 \quad (1)$$

Similarly, when the thicknesses in the plate thickness direction at the central positions on each opposing long side of the outer peripheral surfaces are represented by Ay1 and Ay2, the average Ay of the thicknesses at the centers on the opposing long sides of the outer peripheral surfaces is defined by the following expression (2).

$$Ay = (Ay1 + Ay2)/2 \quad (2)$$

The thickness B at the central portion of the plate surface means the thickness in the plate thickness direction of the central portion (intersection of diagonal lines of rectangle) of the rectangular plate surface. The thickness B is preferably 2 mm to 6 mm, and the thickness B is more preferably 3 mm to 6 mm.

In the aluminum-silicon carbide composite 1 according to the present embodiment, a ratio (Ax/B) between the average Ax of the thicknesses at the centers on opposing short sides of outer peripheral surfaces and the thickness B at central portions of the plate surfaces satisfies the relationship: $0.91 \leq Ax/B \leq 1.00$. In addition, a ratio (Ay/B) between the average Ay of the thicknesses at the centers on opposing long sides of outer peripheral surfaces and the thickness B at central portions of the plate surfaces satisfies the relationship: $0.94 \leq Ay/B \leq 1.00$.

By having such a configuration, the shape of the curvature of the whole composite body becomes appropriate at the time when the circuit board is mounted on the aluminum-silicon carbide composite, adhesiveness between the aluminum-silicon carbide composite and another heat-dissipating component is enhanced, and a cooling effect for the heat-dissipating component is improved.

In the aluminum-silicon carbide composite 1 of the present embodiment, when the circuit board is mounted thereon, the amount of curvature Cx for every 10 cm in the short-side direction of the outer peripheral surfaces satisfies the relationship: $-10 \ \mu m \leq Cx \leq 30 \ \mu m$; and it is more preferable that the amount of curvature Cy for every 10 cm in the long-side direction of the outer peripheral surfaces satisfies the relationship: $-10 \ \mu m \leq Cy \leq 40 \ \mu m$.

Thereby, the cooling effect is enhanced at the time when the aluminum-silicon carbide composite of the present embodiment is joined to another heat-dissipating component. This is because the adhesiveness between the aluminum-silicon carbide composite and another heat-dissipating component is enhanced by that the amount of curvature at the time when the circuit board is mounted is specified to the above described range.

In the present embodiment, a straight line is assumed that connects endpoints of a line segment in the long-side direction or the short-side direction of the plate surface of a heat-dissipating component in which the central portion of a flat-plate-shaped heat-dissipating component (where central portion of heat-dissipating component may be defined as intersection of diagonal lines on plate surface of flat plate having approximately rectangular shape) becomes a middle point, a length of a perpendicular line is measured which passes through the above described central portion among perpendicular lines of the straight line, and numerical values obtained by converting the lengths into amounts for every 10 cm are defined as amounts of curvature Cx (short-side direction) and Cy (long-side direction).

For instance, in the example of FIG. 5, the central portion O of the heat-dissipating component becomes the middle point, and P1 and P2 become end points of a line segment in the long-side direction or the short-side direction. A straight line which connects P1 and P2 is assumed, and the length of the perpendicular line shall be represented by Z, which has been drawn from this straight line to the central portion O. At this time, the length of the straight line that connects P1 and P2 shall be represented by X, and a value of the length Z with respect to the length X shall be the amount of the curvature. Here, a converted value of the length Z at the time when the length X is 10 cm shall be defined as the amounts of curvature Cx or Cy for every 10 cm.

As for the amounts of curvature Cx and Cy, the curvature that forms a convex toward the heat-dissipating surface side of the aluminum-silicon carbide composite is defined as a positive value (for instance, 20 μm), and a curvature that forms a concave thereto is defined as a negative value (for instance, −5 μm).

In the aluminum-silicon carbide composite 1 of the present embodiment, it is preferable that the average thickness of the aluminum layer on the surface on which the circuit board is mounted is 0.1 mm to 0.3 mm.

When the average thickness of the aluminum layer on the surface having the circuit board mounted thereon is 0.1 mm or more, chipping is suppressed that occurs by a phenomenon and the like in which a working blade hits an SiC preform structural portion in the aluminum-silicon carbide composite during machining, and a plating failure becomes hard to occur which occurs due to that the SiC preform structural portion in the aluminum-silicon carbide composite is exposed. If the average thickness is 0.3 mm or less, the amount of the aluminum occupying in the whole composite does not increase, and a coefficient of thermal expansion can be suppressed to be low.

A thickness difference of the aluminum layer at the surface having the circuit board mounted thereon is preferably 0.1 mm or less. More preferably, the thickness difference is 0.05 mm or less.

When the thickness difference of the aluminum layer at the surface having the circuit board mounted thereon is 0.1 mm or less, in the case where the aluminum-silicon carbide composite has been subjected to machining, a large change of the curvature can be thereby suppressed when annealing treatment has been performed after the machining. Furthermore, the occurrence of cracks due to the heat that is transferred from the mounted element can be suppressed.

In the aluminum-silicon carbide composite 1 of the present embodiment, it is more preferable that the difference between the average thickness of the aluminum layer on the surface on which the circuit board is mounted and the average thickness of the aluminum layer on the heat-dissipating surface is 50% or less of the average thickness of the thicker aluminum layer.

The difference between the average thickness of the aluminum layer on the surface on which the circuit board is mounted and the average thickness of the aluminum layer on the heat-dissipating surface is 50% or less of the average thickness of the thicker aluminum layer, and thereby it can be suppressed that the thermal conductivity decreases and the amount of curvature of the composite changes due to a difference between coefficients of thermal expansion of the aluminum layer on both of the plate surfaces, when the annealing treatment is performed for removing the working distortion.

It is more preferable that the aluminum-silicon carbide composite 1 of the present embodiment has a thermal conductivity at 25° C. of 180 W/mK or more, and a coefficient of thermal expansion at 150° C. of $10 \times 10^{-6}$/K or less.

Because of having the thermal conductivity at 25° C. of 180 W/mK or more, the aluminum-silicon carbide composite 1 is preferably used as a base plate that has a circuit board mounted thereon and is joined to another heat-dissipating component. In addition, because of having the coefficient of thermal expansion at 150° C. of $10 \times 10^{-6}$/K or less, the aluminum-silicon carbide composite 1 resists causing a crack and the like, when having been used as a base plate that has a circuit board mounted thereon and is joined to another heat-dissipating component.

In the aluminum-silicon carbide composite 1 of the present embodiment, the amount of the change of the amount Dy of curvature for every 10 cm in the long-side direction of the heat-dissipating surface may be 15 μm or less, before and after the annealing treatment for removing the working distortion. Thereby, there is an effect that the change of the shape due to the thermal cycle is small at the time when the aluminum-silicon carbide composite 1 is actually used.

It is preferable to perform the annealing treatment for removing the working distortion at a temperature of 400° C. to 550° C. for 10 minutes or longer.

If the annealing temperature is 400° C. or higher and the annealing time period is 10 minutes or longer, the distortion in the composite is sufficiently released, and a large change of curvature can be suppressed, which occurs due to a subsequent soldering step of a circuit board and the like. In addition, when the annealing temperature is 550° C. or lower, it does not occur that the impregnated aluminum alloy melts.

In the above described example, the aluminum-silicon carbide composite has a rectangular plate surface having a short side and a long side, but the lengths of the short side and the long side of the outer peripheral surface may be equal, as is shown in FIG. 3.

In this case, a ratio (A/B) between the average (A) of the thicknesses at the centers on opposing sides of outer peripheral surfaces and the thickness (B) at central portions of the plate surfaces preferably satisfies the relationship: $0.91 \leq A/B \leq 1.00$.

When the lengths of the short side and the long side of the outer peripheral surface are equal, the amount C of curvature for every 10 cm in the side direction at the time when the circuit board is mounted may satisfy the relationship: $-10 \mu m \leq Cx \leq 30 \mu m$.

In addition, the aluminum-silicon carbide composite having a rectangular plate surface as shown in FIG. 4 is also one embodiment of the present invention.

The aluminum-silicon carbide composite according to the above embodiment has aluminum layers on both plate surfaces thereof, and the heat-dissipating surface thereof can be worked in an ideal spherical shape: and accordingly when being used as a base plate, the aluminum-silicon carbide composite shows an adequate contact between the base plate and a heat-dissipating component such as a radiating fin, and shows an effect of being excellent in heat-dissipating characteristics of a module that is composed of a ceramic circuit board, the base plate, the radiating fin and the like.

The aluminum-silicon carbide composite according to the above described embodiment has the thermal conductivity at 25° C. of 180 W/mK or more, and the coefficient of thermal expansion at 150° C. can reach $10 \times 10^{-6}$/K or less. In addition to the above described effects, the aluminum-silicon carbide composite has high thermal conductivity and low expansion coefficient of the same level as those of a semiconductor component and a ceramic circuit board, and accordingly has advantages that the heat-dissipating component using the aluminum-silicon carbide composite and furthermore the module using the heat-dissipating component are excellent in heat-dissipating characteristics, are less likely to be deformed even though having received a temperature change, and as a result, provides high reliability.

The aluminum-silicon carbide composite according to the above described embodiment has adequate heat-dissipating characteristics and stress relaxation properties, and is suitable as a base plate which lies, for instance, between a ceramic circuit board and a heat-dissipating component such as a radiating fin.

Next, one embodiment of a method for producing an aluminum-silicon carbide composite according to the present invention will be described.

[Production Method]

A method for producing the aluminum-silicon carbide composite of the present embodiment includes: a step of forming a flat-plate-shaped silicon carbide porous body; a step of machining one plate surface of the silicon carbide porous body so as to form a convex curved shape; a step of impregnating the silicon carbide porous body with an aluminum alloy so as to produce an aluminum-silicon carbide composite including a flat-plate-shaped composited portion containing silicon carbide and an aluminum alloy, and aluminum layers, containing an aluminum alloy, provided on both plate surfaces of the composited portion; and a step of machining the aluminum layer on the side of the silicon carbide porous body having the surface that has been machined to a convex curved shape, so as to form a heat-dissipating surface having a convex curved shape.

The production method that is preferably used for preparing the aluminum-silicon carbide composite of the present invention is a high-pressure forging method of performing impregnation under high pressure, and can adopt a forging cast process and a die casting method. The high-pressure forging method is a method of charging a ceramic porous body (preform) in a high-pressure container, and impregnating the ceramic porous body with a molten metal of an aluminum alloy at high pressure to produce a composite.

The forging cast process is particularly preferable for the production of the aluminum-silicon carbide composite of the present invention, because of being capable of stably producing the aluminum-silicon carbide composite in large quantities. The production method by the forging cast process will be described below.

In the step of forming the flat-plate-shaped silicon carbide porous body, a method of producing the silicon carbide porous body (SiC preform) is not limited in particular, and the silicon carbide porous body can be produced by a known method. For instance, the silicon carbide porous body can be obtained by a process of adding silica, alumina or the like which is a binder, to silicon carbide (SiC) powder which is a raw material, mixing and molding the materials, and firing the molded component at 800° C. or higher.

The molding method is not limited in particular, but press molding, extrusion molding, cast molding and the like can be used, and it is possible to use a binder for retaining a shape in combination, as needed.

Important characteristics for the aluminum-silicon carbide composite which is produced by a step of impregnating the silicon carbide porous body with aluminum or an alloy thereof are the thermal conductivity and the coefficient of thermal expansion. The higher is the SiC content in the silicon carbide porous body, the higher is the thermal conductivity and the smaller is the coefficient of thermal expansion, which are preferable, but when the content becomes high, there is a case where the aluminum-silicon carbide composite is not sufficiently impregnated with the aluminum alloy.

The silicon carbide porous body is practically preferable which contains 40 mass % or more of coarse SiC particles having an average particle size of preferably 40 μm or more, and contains the SiC preform of which the relative density is in a range of preferably 55% to 75%. It is preferable that the strength of the SiC preform is 3 MPa or more in bending strength, in order to prevent cracking at the time of handling and/or during impregnation. It is possible to measure the average particle size by calculating an average value of the sizes obtained by determining the sizes of 1000 pieces of particles with the use of a scanning electron microscope (for instance, "JSM-T 200 type" made by JEOL Ltd.) and an image analysis apparatus (for instance, made by Nippon Avionics Co., Ltd.). In addition, the relative density can be measured by the Archimedes method or the like.

It is preferable to adjust the particle size of the SiC powder which is the raw material of the SiC preform. When the preform is produced only of a coarse powder, strength-developing properties decrease, but on the other hand, when the preform is produced only of a fine powder, the composite to be obtained cannot expect having high thermal conductivity in some cases. A mixed powder is preferable in which 40 mass % to 80 mass % of an SiC coarse powder having an average particle size of preferably 40 μm to 150 μm is mixed with 60 mass % to 20 mass % of an SiC fine powder having an average particle size of preferably 5 μm to 15 μm.

The SiC preform is obtained by a process of degreasing and firing a molded body of a mixture in which a binder is added to the above described SiC powder. If the firing temperature is 800° C. or higher, the SiC preform is obtained of which the bending strength is 3 MPa or more, irrespectively of the atmosphere at the time of firing.

In an oxidative atmosphere, when the SiC preform is fired at a temperature exceeding 1100° C., the oxidation of the SiC is promoted and the thermal conductivity of the aluminum-silicon carbide composite may result in decreasing, and accordingly, it is preferable to fire the SiC preform at a temperature of 1100° C. or lower, in the oxidative atmosphere. The firing time period is appropriately determined according to conditions such as the size of the SiC preform, the amount charged into a firing furnace, and the firing atmosphere.

In the case where the SiC preform is formed into a predetermined shape at the time of molding, it is possible to prevent the curved shape from changing due to drying, by drying the SiC preform one by one, or drying the SiC preforms by using the spacer made from carbon or the like between the SiC preforms, which has a shape equal to the preform shape. In addition, also concerning the firing, it is possible to prevent the change of the shape, which accompanies the change of an internal structure, by performing similar treatment to that at the time of drying.

In the step of machining one plate surface of the silicon carbide porous body so as to form a convex curved shape, one plate surface of the SiC preform is worked so as to have a convex curved shape, by a cutting tool such as a lathe. Thus, the plate surface is subjected to cut working at the stage of the preform, accordingly it is not necessary to use a special cutting tool or the like, and the shape of the curvature can be easily formed.

Next, the silicon carbide porous body passes through a step of impregnating the silicon carbide porous body with an aluminum alloy by a high-pressure casting method or the like to produce the aluminum-silicon carbide composite having the flat-plate-shaped composited portion containing silicon carbide and an aluminum alloy, and aluminum layers containing an aluminum alloy provided on both plate surfaces of the composited portion.

As a method of impregnating the SiC preform with the aluminum alloy to produce the aluminum-silicon carbide composite, there is the following method, for instance.

The method includes accommodating the SiC preform in a molding box, arranging one or more types of fibers, spherical particles and particles having crushed shapes which are formed from alumina or silica, so as to come in direct contact with both of the plate surfaces of the above described molding box, and forming the materials as one block.

The aluminum-silicon carbide composite having the aluminum layers provided on both of the plate surfaces is produced by a process of preliminarily heating the above described block at approximately 500 to 650° C., arranging one heated block or two or more of the heated blocks in a high-pressure container, pressurizing a molten metal of the aluminum alloy at a pressure of 30 Mpa or higher as quickly as possible in order to prevent the temperature of the block from lowering, and impregnating the airspace in the SiC preform with the aluminum alloy.

It is preferable that the melting point of the aluminum alloy in the aluminum-silicon carbide composite is as low as possible, in order that the aluminum alloy sufficiently penetrates into the airspace in the preform at the time of the impregnation.

An example of such an aluminum alloy includes, for instance, an aluminum alloy containing 7 to 25 mass % of silicon. It is preferable that the aluminum alloy further includes magnesium in a range of 0.2 mass % to 5 mass %, because binding becomes stronger between the silicon carbide particles and the metal portion. A metal component other than aluminum, silicon and magnesium in the aluminum alloy is not limited in particular, as long as the characteristics are not extremely changed, and the aluminum alloy may contain, for instance, copper or the like.

The aluminum alloy to be used includes preferably AC4C, AC4CH, ADC12 and the like which are a casting alloy.

Incidentally, it is acceptable for the purpose of removing the distortion at the time of the impregnation to subject the aluminum-silicon carbide composite to the annealing treatment after the aluminum-silicon carbide composite has been produced.

It is preferable to perform the annealing treatment of which the purpose is to remove the distortion that has been formed when the SiC preform has been impregnated with the aluminum alloy, at a temperature of 400° C. to 550° C. for 10 minutes or longer. When the annealing temperature is 400° C. or higher, the distortion in the inner part of the composite is sufficiently released, and a large change of the curvature is suppressed, which occurs in the annealing treatment step after machining. On the other hand, when the annealing temperature is 550° C. or lower, the aluminum alloy can be prevented from melting, which has been used in the impregnation. When the annealing time is 10 minutes or longer, even when the annealing temperature is 400° C. to 550° C., the distortion in the inner part of the composite is sufficiently released, and in the annealing treatment step for removing the working distortion after machining, a large change of the curvature can be suppressed.

In the step of impregnating the SiC preform with the aluminum alloy, the aluminum layer having a predetermined thickness is formed by an operation of arranging one or more types of fibers, spherical particles and particles having crushed shapes, which are formed from alumina or silica, so as to come in direct contact with the surface of the SiC preform. Thereby, not only the aluminum layer having the predetermined thickness can be formed but also there are advantages that the aluminum-silicon carbide composite shows little color unevenness after the impregnation, and acquires improved workability at the time of shape addition.

It is preferable to control the content of materials in the aluminum layer, which are selected from one or more types of fibers, spherical particles and particles having a crushed shape, which are formed of alumina or silica, preferably to 5 mass % to 40 mass %, and particularly preferably to 10 mass % to 20 mass %, with respect to the mass of the aluminum-silicon carbide composite.

If the content is 5 mass % or more, it is easy to control the thicknesses of the aluminum layers on both of the plate surfaces, and it is possible to suppress the large change of the curvature due to the annealing treatment after working. When the content is 40% by mass or less, the aluminum alloy layer does not become excessively hard, and general machining can be easily performed.

As for the thicknesses of the aluminum layers provided on the surfaces of the aluminum-silicon carbide composite, when the both of the plate surfaces are worked by machining, the thicknesses of both of the plate surfaces may be equal to each other, but when only the heat-dissipating surface side is worked, it is better to previously adjust the thickness of the heat-dissipating-surface-side aluminum layer to be worked to be thick so that the thicknesses of the aluminum layers of both of the plate surfaces after working are not largely different from each other.

The average thickness of the aluminum layer on the surface having the circuit board mounted thereon is preferably 0.1 mm to 0.3 mm, and the difference between the average thicknesses of the aluminum layers on both of the plate surfaces is preferably 50% or less of the average thickness of the thicker aluminum layer.

In the case where the thickness of the heat-dissipating-surface-side aluminum layer has been made thick beforehand, it is preferable to work only the heat-dissipating surface side and adjust the difference between the average thicknesses of the aluminum layers on both of the plate surfaces preferably to be 40% or less of the average thickness of the aluminum layer on the heat-dissipating surface, and particularly preferably to be 30% or less thereof. This is because it becomes possible to suppress the change of the amount of the curvature of the composite, which occurs due to the difference between the coefficients of the thermal expansion of the aluminum layers on both of the plate surfaces.

In the step of forming a heat-dissipating surface having a convex curved shape by machining the aluminum layer on the surface side of the silicon carbide porous body, which has been machined to a convex curved shape, the curved shape is formed to have the heat-dissipating surface of the aluminum-silicon carbide composite, by a cutting tool such as a lathe. In order to fix the workpiece to be worked to the lathe or the like, a method of screwing the workpiece to be worked by using the hole or the like is generally used which is provided on the peripheral edge portion of the workpiece to be worked. In the present embodiment, the aluminum layer on the surface of the aluminum-silicon carbide composite is machined, accordingly it is possible to obtain the heat-dissipating surface that has an ideal spherical shape, and it is possible to obtain the aluminum-silicon carbide composite that has adequate heat-dissipating characteristics and stress relaxation properties.

Incidentally, the total of the average thicknesses of the aluminum layers on both of the plate surfaces at the time after the above described machining process is preferably 1.0 mm or less, and particularly preferably is 0.6 mm or less. When the total of the average thicknesses of the aluminum layers on both of the plate surfaces is 1.0 mm or less, the coefficient of thermal expansion of the whole aluminum-silicon carbide composite is suppressed to be small, and when a thermal load is applied to the aluminum-silicon carbide composite after a semiconductor component has been mounted thereon, it is suppressed that cracking occurs in a solder layer due to a difference between the coefficients of thermal expansion of the aluminum-silicon carbide composite and the ceramic circuit board.

The above described aluminum-silicon carbide composite of the above embodiment has high adhesiveness to other heat-dissipating components, and is preferably used as a base material of a ceramic circuit board on which a semiconductor component is mounted.

EXAMPLE 1

A silicon carbide powder A (NG-150, made by Pacific Rundum Co., Ltd., average particle size: 100 μm) in an amount of 70 g, a silicon carbide powder B (GC-1000F made by Yakushima Denko Co., Ltd., average particle size: 10 μm) in an amount of 30 g and silica sol (Snowtex®, made by Nissan Chemical Industries, Ltd.) in an amount of 10 g were weighed out, were mixed by a stirring mixer for 30 minutes, and were press-molded at a pressure of 10 MPa into a flat plate shape having a size of 185 mm×135 mm×4.6 mm.

The obtained molded body was fired in the air at a temperature of 900° C. for 2 hours, and a SiC preform having a relative density (bulk density) of 65 vol % was obtained.

The surface of the SiC preform, which would become a heat-dissipating surface of the completed aluminum-silicon carbide composite, was machined to a convex curved shape with a lathe of R=14 m.

A stacked body was preliminary heated to 620° C. in an electric furnace, which was integrally formed by a process of arranging alumina fibers (made by Tanaka Paper Industries Co., Ltd., purity of 97%, in sheet form) on both surfaces of the machined SiC preform, and sandwiching the both of the surfaces with carbon-coated SUS plates.

Next, the preliminarily heated stacked body was set in a previously heated pressing mold having an inner diameter of 300 mm, a molten aluminum alloy containing 12 mass % of silicon and 0.5 mass % of magnesium was poured into the pressing mold, and the pressing mold was pressurized at a pressure of 100 MPa for 20 minutes to impregnate a silicon carbide porous body with the aluminum alloy.

After the impregnated stacked body was cooled to room temperature, an iron frame and the like were cut with a wet band saw, and the sandwiching SUS plates were peeled off. After this, the resultant composite was subjected to annealing treatment at 530° C. for 4 hours, in order to remove the distortion formed at the time of the impregnation, and the aluminum-silicon carbide composite was obtained.

A working hole having a diameter of 7 mm was provided at four corners of the peripheral portions of the aluminum-silicon carbide composite, and the aluminum-silicon carbide composite was fixed to the lathe jigs by screws with the use of the working holes. A thickness difference of the aluminum layer at the surface having the circuit board mounted thereon was set at 0.05 mm, and the average thickness of the aluminum layer on the surface having the circuit board mounted thereon was set at 0.15 mm. In addition, the average thickness of the aluminum layer on the heat-dissipating surface was set at 0.20 mm.

The thicknesses were measured at two points of the centers of two short sides of the outer peripheral surface of the aluminum-silicon carbide composite, and the average (Ax) thereof was calculated; and thicknesses were measured at the two points of the centers of the two long sides thereof, and the average (Ay) was calculated. The outer peripheral surfaces were machined so that a ratio (Ax/B) between (Ax) and the thickness (B) at the central portion becomes 0.91, and a ratio (Ay/B) between (Ay) and the thickness (B) at the central portion becomes 0.94.

Then, the occurrence of cracking after machining was visually checked.

After the machining, the resultant composite was subjected to the annealing treatment at 530° C. for 4 hours with the use of a muffle furnace to have the working distortion removed. Then, the amount of curvature was measured at the time before the circuit board was mounted. The results are shown in Tables 1 and 2.

A circuit was formed on the surface having the circuit board mounted thereon of the aluminum-silicon carbide composite at the time after the annealing treatment, and an aluminum nitride circuit board (size: 48.4 mm×57.3 mm×0.6 mmt) was mounted.

Then, the amount of curvature was measured at the time after the circuit board was mounted. The measurement conditions for the amount of curvature were determined as in the following conditions. The results are shown in Tables 1 and 2.

Apparatus: laser three-dimensional shape measuring apparatus

XYθ stage unit: K2-300 (made by Kohzu Precision Co., Ltd.)

High-precision laser displacement meter: LK-G 500 (made by Keyence Corporation)

Motor controller: SC-200K (made by Kohzu Precision Co., Ltd.)

AD converter: DL-100 (made by Kohzu Precision Co., Ltd.)

Measurement condition: measurement ranges in a short-side direction and a long-side direction of the circuit board were set at 135 mm and 185 mm, respectively, and the shape was measured at a measurement pitch of 2.5 mm.

Here, from the result of the shape measurement, a difference between the thicknesses was determined to be Z in FIG. 5, which were the thickness of the central portion (O in FIG. 5) described in paragraph "0024" of the above described embodiment, and the thicknesses of end points (P1 and P2 in FIG. 5) of the line segment that extends from the central portion toward the short-side direction or the long-side direction, and of which the length of the assumed straight line is 10 cm. The values Z were determined for each of the short-side direction and the long-side direction, and were determined to be the amounts Cx and Cy of curvature for every 10 cm.

EXAMPLE 2

The aluminum-silicon carbide composite was produced through similar steps to those in Example 1, except that a thickness difference of the aluminum layer at the surface having the circuit board mounted thereon was 0.09 mm, that the average thickness of the aluminum layer on the surface having the circuit board mounted thereon was 0.17 mm and the average thickness of the aluminum layer on the heat-dissipating surface was 0.17 mm, and that (Ax/B) was 1.00 and (Ay/B) was 1.00.

After the machining, the resultant composite was subjected to the annealing treatment at 530° C. for 4 hours with the use of a muffle furnace to have the working distortion removed. A circuit was formed on the circuit surface of the aluminum-silicon carbide composite at the time after the annealing treatment, and an aluminum nitride circuit board (size: 48.4 mm×57.3 mm×0.6 mmt) was mounted.

Then, the amount of curvature was measured at the time after the mounting. The results are shown in Tables 1 and 2.

EXAMPLE 3

The aluminum-silicon carbide composite was produced by similar steps to those in Example 1, except that the size of the SiC preform was 135 mm×135 mm, (Ax/B) was 0.96 and (Ay/B) was 0.96, and that the average thickness of the aluminum layer on the surface having the circuit board mounted thereon was 0.20 mm and the average thickness of the aluminum layer on the heat-dissipating surface was 0.21 mm. The results are shown in Tables 1 and 2. As for the measurement condition of the amount of curvature, the measurement range was set at 135 mm for each side direction of the circuit board.

COMPARATIVE EXAMPLE 1

The aluminum-silicon carbide composite was produced through similar steps to those in Example 1, except that a thickness difference of the aluminum layer at the surface having the circuit board mounted thereon was 0.09 mm, that the average thickness of the aluminum layer on the surface having the circuit board mounted thereon was 0.10 mm and the average thickness of the aluminum layer on the heat-dissipating surface was 0.15 mm, and that (Ax/B) was 0.90 and (Ay/B) was 0.93.

After the machining, the resultant composite was subjected to the annealing treatment at 530° C. for 4 hours with the use of a muffle furnace to have the working distortion removed. A circuit was formed on the circuit surface of the aluminum-silicon carbide composite at the time after the annealing treatment, and an aluminum nitride circuit board (size: 48.4 mm×57.3 mm×0.6 mmt) was mounted.

Then, the amount of curvature was measured at the time after the mounting.

The results are shown in Tables 1 and 2.

COMPARATIVE EXAMPLE 2

The aluminum-silicon carbide composite was produced through similar steps to those in Example 1, except that a thickness difference of the aluminum layer at the surface having the circuit board mounted thereon was 0.08 mm, that the average thickness of the aluminum layer on the surface having the circuit board mounted thereon was 0.25 and the average thickness of the aluminum layer on the heat-dissipating surface was 0.25, and that (Ax/B) was 1.01 and (Ay/B) was 1.01.

After the machining, the resultant composite was subjected to the annealing treatment at 530° C. for 4 hours with the use of a muffle furnace to have the working distortion removed. A circuit was formed on the circuit surface of the aluminum-silicon carbide composite at the time after the annealing treatment, and an aluminum nitride circuit board (size: 48.4 mm×57.3 mm×0.6 mmt) was mounted.

Then, the amount of curvature was measured at the time after the mounting. The results are shown in Tables 1 and 2.

COMPARATIVE EXAMPLE 3

The aluminum-silicon carbide composite was produced through similar steps to those in Example 1, except that a thickness difference of the aluminum layer at the surface having the circuit board mounted thereon was 0.13 mm, that the average thickness of the aluminum layer on the surface having the circuit board mounted thereon was 0.10 mm and the average thickness of the aluminum layer on the heat-dissipating surface was 0.20 mm, and that (Ax/B) was 0.92 and (Ay/B) was 0.93.

After the machining, the resultant composite was subjected to the annealing treatment at 530° C. for 4 hours with the use of a muffle furnace to have the working distortion removed. A circuit was formed on the circuit surface of the aluminum-silicon carbide composite at the time after the annealing treatment, and an aluminum nitride circuit board (size: 48.4 mm×57.3 mm×0.6 mmt) was mounted.

Then, the amount of curvature was measured at the time after the mounting. The results are shown in Tables 1 and 2.

The thickness difference of the aluminum layer at the surface having the circuit board mounted thereon was obtained by a process of cutting the aluminum-silicon carbide composites that were obtained by the methods for the examples and the comparative examples, along diagonal lines of each sample, and measuring the thicknesses at 20 points of the aluminum layers on both plate surfaces, which were exposed by being cut, at equal intervals on the diagonal lines.

Table 2 shows the measurement results on the thermal conductivity and the coefficient of thermal expansion of the aluminum-silicon carbide composites of the above described examples and comparative examples.

TABLE 1

| | Ratio between thicknesses | | Amount of curvature | | | |
| --- | --- | --- | --- | --- | --- | --- |
| | | | Before mounting | | After mounting | |
| | Ax/B | Ay/B | Cx (μm) | Cy (μm) | Cx (μm) | Cy (μm) |
| Example 1 | 0.91 | 0.94 | −19 | −19 | −9 | −9 |
| Exemple 2 | 1.00 | 1.00 | 15 | 18 | 30 | 39 |
| Example 3 | 0.96 | 0.96 | 5 | 5 | 16 | 16 |
| Comparative Example 1 | 0.90 | 0.93 | −20 | 20 | −11 | 42 |
| Comparative Example 2 | 1.01 | 1.01 | 18 | −5 | 32 | −13 |
| Comparative Example 3 | 0.92 | 0.93 | −20 | −19 | −10 | −8 |

TABLE 2

| | Thickness difference of aluminum layer at surface having circuit board mounted thereon | Presence or absence of crack | Thermal conductivity (W/mK) | Coefficient of thermal expansion (×10⁻⁶/K) |
|---|---|---|---|---|
| Example 1 | 0.05 mm | なし | 202 | 7.6 |
| Example 2 | 0.09 mm | なし | 197 | 7.6 |
| Example 3 | 0.05 mm | なし | 199 | 7.6 |
| Comparative Example 1 | 0.09 mm | なし | 195 | 7.5 |
| Comparative Example 2 | 0.08 mm | なし | 185 | 7.6 |
| Comparative Example 3 | 0.13 mm | あり | 193 | 7.5 |

As is understood from the above described results, in the aluminum-silicon carbide composite according to the present invention, the heat-dissipating surface has a convex curved shape, (Ax/B) satisfies the relationship: $0.91 \leq Ax/B \leq 1.00$, and (Ay/B) satisfies the relationship: $0.94 \leq Ay/B \leq 1.00$. Accordingly, the shape of the curvature of the whole composite body becomes appropriate at the time after the circuit board has been mounted on the aluminum-silicon carbide composite, and the aluminum-silicon carbide composite shows such effects that adhesiveness between the aluminum-silicon carbide composite and another heat-dissipating component is enhanced, and a cooling effect for the heat-dissipating component is enhanced.

In Comparative Examples 1 and 2, it is understood that the curvature directions of Cx and Cy are opposite to each other. Because the surfaces are curved to such shapes, a gap is formed between the aluminum-silicon carbide composite and another heat-dissipating component, and the adhesiveness decreases. As a result, the cooling effect to be shown as the heat-dissipating component is lowered.

In Comparative Example 3, a crack occurs, which is considered to be because the thickness difference of the aluminum layer at the surface having the circuit board mounted thereon is 0.13 mm.

As is understood from the above described experimental results, the aluminum-silicon carbide composite according to the present invention has an amount of curvature in a preferable range as a base material of a ceramic circuit board on which a semiconductor component is mounted.

REFERENCE SIGNS LIST

1 Aluminum-silicon carbide composite
2 Through hole

The invention claimed is:

1. An aluminum-silicon carbide composite comprising a flat-plate-shaped composited portion containing silicon carbide and an aluminum alloy, and aluminum layers containing an aluminum alloy provided on both plate surfaces of the composited portion, wherein a circuit board is mounted on one of the plate surfaces and the other plate surface is used as a heat-dissipating surface, and wherein:
   the heat-dissipating-surface-side plate surface of the composited portion has a convex curved shape;
   the heat-dissipating-surface-side aluminum layer has a convex curved shape;
   a ratio (Ax/B) before a circuit board is mounted between the average (Ax) of the thicknesses at the centers on opposing short sides of outer peripheral surfaces and the thickness (B) at central portions of the plate surfaces satisfies the relationship:
   $0.91 \leq Ax/B \leq 1.00$; and
   a ratio (Ay/B) before a circuit board is mounted between the average (Ay) of the thicknesses at the centers on opposing long sides of outer peripheral surfaces and the thickness (B) at central portions of the plate surfaces satisfies the relationship:
   $0.94 \leq Ay/B \leq 1.00$.

2. The aluminum-silicon carbide composite according to claim 1, wherein, when a circuit board is mounted, the amount of curvature Cx for every 10 cm in the short-side direction of the outer peripheral surfaces satisfies the relationship:
   $-10 \text{ μm} \leq Cx \leq 30 \text{ μm}$; and
   the amount of curvature Cy for every 10 cm in the long-side direction of the outer peripheral surfaces satisfies the relationship:
   $-10 \text{ μm} \leq Cy \leq 40 \text{ μm}$.

3. The aluminum-silicon carbide composite according to claim 1, wherein the lengths of the short sides and the long sides of the outer peripheral surfaces are equal; and
   a ratio (A/B) between the average (A) of the thicknesses at the centers on opposing sides of outer peripheral surfaces and the thickness (B) at central portions of the plate surfaces satisfies the relationship:
   $0.91 \leq A/B \leq 1.00$.

4. The aluminum-silicon carbide composite according to claim 1, wherein the average thickness of the aluminum layer on the surface on which the circuit board is mounted is 0.1 mm to 0.3 mm, and the thickness difference of the aluminum layer at said surface is 0.1 mm or less.

5. The aluminum-silicon carbide composite according to claim 1, wherein the difference between the average thickness of the aluminum layer on the surface on which the circuit board is mounted and the average thickness of the aluminum layer on the heat-dissipating surface is 50% or less of the average thickness of the thicker aluminum layer.

6. The aluminum-silicon carbide composite according to claim 1, having a thermal conductivity at 25° C. of 180 W/mK or more, and a coefficient of thermal expansion at 150° C. of $10 \times 10^{-6}$/K or less.

7. A method for producing the aluminum-silicon carbide composite according to claim 1, the method comprising:
   forming a flat-plate-shaped silicon carbide porous body;
   machining one plate surface of the silicon carbide porous body so as to form a convex curved shape;

impregnating the silicon carbide porous body with an aluminum alloy so as to produce an aluminum-silicon carbide composite comprising a flat-plate-shaped composited portion containing silicon carbide and an aluminum alloy, and aluminum layers, containing an aluminum alloy, provided on both plate surfaces of the composited portion; and machining the aluminum layer on the side of the silicon carbide porous body having the surface that has been machined to a convex curved shape, so as to form a heat-dissipating surface having a convex curved shape.

8. The aluminum-silicon carbide composite according to claim 1, wherein the thickness (B) is from 2 mm to 6 mm.

\* \* \* \* \*